(12) United States Patent
Taicher et al.

(10) Patent No.: US 7,366,559 B2
(45) Date of Patent: Apr. 29, 2008

(54) NUCLEAR MAGNETIC RESONANCE APPARATUS AND METHOD FOR ASSESSING WHOLE BODY COMPOSITION

(75) Inventors: Gersh Z. Taicher, Houston, TX (US); Arcady Reiderman, Houston, TX (US)

(73) Assignee: Echo Medical Systems, LLC, Houston, TX (US)

( * ) Notice: Subject to any disclaimer, the term of this patent is extended or adjusted under 35 U.S.C. 154(b) by 799 days.

(21) Appl. No.: 10/606,943

(22) Filed: Jun. 26, 2003

(65) Prior Publication Data

US 2005/0010103 A1 Jan. 13, 2005

(51) Int. Cl.
*A61B 5/05* (2006.01)
*G01V 3/00* (2006.01)

(52) U.S. Cl. .................. 600/410; 600/407; 324/307; 324/316; 324/317; 324/318; 324/319; 324/320

(58) Field of Classification Search ............... 600/407, 600/410, 411, 415
See application file for complete search history.

(56) References Cited

U.S. PATENT DOCUMENTS

| | | | |
|---|---|---|---|
| 4,034,191 A * | 7/1977 | Tomlinson et al. .......... 702/77 |
| 4,144,763 A | 3/1979 | Vogelman | |
| 4,585,993 A * | 4/1986 | Bottomley ................. 324/309 |
| 4,720,679 A * | 1/1988 | Patrick et al. ............. 324/309 |
| 5,105,825 A | 4/1992 | Dempster | |
| 5,194,809 A | 3/1993 | Lew | |
| 5,225,781 A | 7/1993 | Glover et al. | |
| 5,235,276 A | 8/1993 | Lew | |
| 5,402,787 A * | 4/1995 | Van Yperen ............... 600/410 |
| 5,415,176 A | 5/1995 | Sato et al. | |
| 5,594,336 A | 1/1997 | Gullapalli et al. | |
| 5,644,232 A | 7/1997 | Smith | |
| 6,147,492 A | 11/2000 | Zhang et al. | |
| 6,233,473 B1 | 5/2001 | Shepherd et al. | |
| 6,717,409 B2 * | 4/2004 | Kimmlingen et al. ....... 324/318 |
| 7,078,899 B2 * | 7/2006 | Dale et al. ................. 324/314 |

OTHER PUBLICATIONS

Mystkowski et al., "Validation of whole-body magnetic resonance spectroscopy as a tool to assess murine body composition." International Journal of Obesity (2000) 24, p. 719-724.*

Kamba et al., "Proton magnetic resonance spectroscopy for assessment of human body composition." Am. J. Clin. Nutr. 2001;73: pp. 172-176.*

Ross et al., "Quantification of adipose tissue by MRI: relationship with anthropometric variables", J. Appl. Physiol. 72(2) : 787-795, 1992.

(Continued)

*Primary Examiner*—Brian L. Casler
*Assistant Examiner*—James Kish
(74) *Attorney, Agent, or Firm*—Richard A. Fagin

(57) ABSTRACT

A method is disclosed for measuring whole body composition. The method includes confining movement of the body to a selected volume, inducing a static magnetic field in the volume, inducing a pulsed radio frequency magnetic field in the volume, and receiving nuclear magnetic resonance signals from the body. The resonance signals from any part of the body are substantially independent of a position of the body part within the volume. Whole body composition is assessed from the resonance signals.

40 Claims, 7 Drawing Sheets

OTHER PUBLICATIONS

Mystkowski et al., "Validation of whole body magnetic resonance spectroscopy as a tool to assess murine body composition" I.J. Obesity 24 719-724 (2000).

Kamman et al., "Multi-exponential relaxation analysis with MR imaging and NMR spectroscopy using fat-water systems" Magnetic Resonance Imaging:5 pp. 381-392, 1987.

* cited by examiner

NUCLEAR MAGNETIC RESONANCE APPARATUS AND METHOD FOR ASSESSING WHOLE BODY COMPOSITION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF INVENTION

1. Field of the Invention

The invention is related to the field of Nuclear Magnetic Resonance (NMR) and Magnetic Resonalnice Imaging (MRI) apparatus and methods. More particularly, the invention relates to apparatus and methods for determining a known component from a mixture of unknown components. More specifically, the invention relates to methods and apparatus for using NMR for precise and quantitative determination of material composition. In one application methods and apparatus according to the invention relate to using NMR for rapid, quantitative in-vivo determination of tissue properties, such as Fat-to-Lean ratio.

2. Background Art

The description of the invention and its background are explained herein in the context of Fat-to-Lean ratio determination. It is to be explicitly understood, however, that the invention is not limited to analysis and monitoring of Fat-to-Lean ratio. For example, Fat-to-Lean-to-Bone ratio may also be determined using methods and apparatus according to the invention. Fat composition (different fatty acids), lean composition (water, protein, and glycogen), and bone composition (mineral, collagen, and water) may also be determined using methods and apparatus according to the invention.

In human health monitoring and treatment, the level of total body mass that is derived from adipose mass is the variable that has been determined empirically to be most closely associated with risk for pathology. Advanced models of body composition and newer technologies that precisely and accurately calculate adipose mass may eventually replace simple anthropometric methods such as body weight, height, waist circumference, skin fold thickness, etc. in determining likelihood of pathology.

Body Mass Index (BMI) is defined as body weight (kg)/height$^2$ (m$^2$). Although BMI is a reasonable marker of energy balance for individuals, it is very rough marker of adiposity across populations.

Hydrostatic weighing or Under Water Weighing (UWW) has been the most preferred technique for human whole body composition analysis for several decades. However, due to several practical inconveniences and questionable underlying assumption its usage is limited. UWW assess whole body fat content expressed as a percentage of body weight. See, for example, U.S. Pat. No. 4,873,866 to Fairbanks.

UWW based on a two-component (2C) body composition model assumes specific densities 0.9 and 1.1 g/cm$^3$ for Fat Mass (FM) and Fat-Free Mass (FFM) respectively. UWW further assumes that these densities are constant within different individuals or populations. Whole body densities have been determined to vary in a range between 1.08 g/cm$^3$ (very lean) and 1.00 g/cm$^3$ (severely obese).

Other UWW techniques are based on four-component (4C) or three-component (3C) body composition models. 4C and 3C models additionally use assumptions that FFM is composed of constant proportions of water (73.2%), minerals (6.8%), and protein (19.5%) each having a specific density assumed to be constant at body temperature. Precise measurement of Total Body Water (TBW) and Bone Mineral Content (BMC) are required to use 4C and 3C models because of the potential for additional error in the final results for FM that is related to TBW and BMC measurements. In certain human population groups, such as children, the elderly, African-Americans, or sick patients, 4C or 3C methods may provide more accurate estimates of FM than the 2C method.

UWW is not practical for accurate measurements in individuals having cardiovascular or pulmonary disorders, elderly, young children, and very obese subjects Substantial errors may occur due to body movement and the buoyant effects of air in the gastrointestinal tract and lungs. The simultaneous measurement of residual lung volume and underwater weight may be preferred because it controls for the effects of the increased pressure of water on the thorax during immersion. Inaccurate measurements of air in the lungs can be a major source of error when estimating body density from underwater weighing. However, UWW may be the only practical method of measuring body fat in very obese subjects who cannot be evaluated by other methods.

U.S. Pat. No. 4,144,763 to Vogelman and U.S. Pat. No. 5,105,825 to Dempster disclose plethysmography apparatuses and methods. Plethysmography is a more convenient way for measuring body adiposity as compared to UWW, Measurement of body density by plethysmography allows for a high degree of precision in volume measurement, but inconsistencies in body density, the necessity for lung volume correction, variation in skeletal mass, and degree of hydration are not accounted for by plethysmography methods.

U.S. Pat. No. 6,393,317 to Fukuda et al. and U.S. Pat. No. 5,415,176 to Sato et al. disclose two examples of widely used techniques for fat assessment based on body bioelectrical impedance. A method for fat assessment based on body electrical conductivity is described by Unangst E. T., Jr., and Merkley L. A. in, *The effects of lipid location on non-invasive estimates of body composition using EM-SCAN technology*, J. Exp. Biol., 2002:205 (Pt. 19) pp. 3101-3105.

None of the foregoing methods of body composition analysis have been broadly implemented, largely because of inaccuracy and poor specificity of the results. Measurement of body composition of experimental animals by plethysmography, hydrostatic weighing (UWW), bioelectrical impedance, and electrical conductivity has not proven to be practical.

In order to provide a more precise quantitative measure of whole body composition in animals, the Dual Energy X-ray Absorptiometry (DEXA) technique is more widely used than the foregoing techniques. U.S. Pat. No. 6,233,473 to Shepherd et al. discloses a method of body composition analysis using a dual-energy, fan-shaped distribution of X-rays, and detector signal processing that corrects for mass magnification and other effects due to the geometry of the measurement system. In the method disclosed in the '473 patent, the thickness of the attenuating material along respective ray paths is obtained by using a four-dimensional look-up table derived experimentally from step-wedge measurements, and another look-up table and interpolation between table entries are used to convert projected mass to true mass.

DEXA precision differs with the instrument type, the particular animal species being evaluated, the software and the actual methods that are used. The basic physical principle of DEXA is associated with attenuation of X-rays transmitted through an object. The degree of attenuation (attenuation coefficient) depends on the object's thickness, density, and chemical composition as well as the initial energy of the X-ray photons. At low initial photon energies (less than about 0.8 million electron volts), photon attenuation is non-linear, and is governed by the photoelectric effect and by Compton scattering. If the object under evaluation is composed of two or more homogeneous materials, then the composite attenuation coefficient may be approximated by a weighted sum of the individual attenuation coefficients, each weighted for its fractional contribution to the total mass.

The attenuation of X-rays through lean human body tissue and fat tissue is slightly different, but is substantially different for bone tissue, primarily because of their differences in density and chemical composition. DEXA does not provide three independent measurements, even though three body composition values: bone; lean; and fat tissue fractional amounts are reported. With increasing initial photon energy, the differences in the attenuation properties for these three types of body tissue decrease.

The following is summary of a DEXA technique for whole body composition analysis of laboratory mice. First, a record is made of the attenuation of X-rays at both initial photon energy values in air. Then the pixel size, scanning speed and beam size are selected. A scan of the object (mouse) is then made. The detected X-ray photon amplitudes and count rates are corrected for detector dead time loss, spill-over from one energy window to another, and for beam hardening. From two equations (two photon energy levels) the amount of soft tissue and bone mineral is then determined.

Soft tissue in the non-bone pixels is separated into fat and lean mass by means of a calibration that translates attenuation coefficients into fat fractions. Corrections are made for tissue thickness variation. The fat content of the soft tissue layer overlying, underlying and/or inside bone is estimated based on predetermined relationships between fat-to-lean ratio of pure soft tissue surrounding bone.

The main advantage of DEXA is the ability to analyze individual regions within an entire body. DEXA as a method for analyzing whole body composition may be subject to the following limitations. First is the assumption that the composition of the soft tissue layer overlying bone has the same Fat-to-Lean ratio, or the ratio is related in a predetermined way to the Fat-to-Lean ratio of other non-bone tissues. For a whole body scan, about 40% of the pixels are typically classified as containing bone. Next, thicker tissue regions remove more low energy photons from the radiation beam as compared to thinner regions, this effect being known as "beam hardening." Further, DEXA assumes homogeneous hydration of lean tissues.

In the field of in-vivo analysis of body composition parameters there have been numerous attempts to Use Nuclear Magnetic Resonance (NMR) methods and apparatus. Briefly, these techniques and their limitations are as follows.

I. Magnetic Resonance Spectroscopy (MRS). Tile MRS method used to quantify fat content in a body is based on recording a $^1H$: (proton) spectrum in-vivo. An example of using a standard MRS apparatus for such analysis is described by Mystkowski et al. in, *Validation whole-body magnetic resonance slpectroscopy as a tool to assess murine body composition*", Int. J. of Obesity, 2000:24, pp. 719-724. A drawback to the technique disclosed in the Mystkowski et al. paper is the fact that many human tissue types contain a variety of lipids which yield $^1H$ spectral peaks within a very narrow chemical shift range In addition, MRS requires very high homogeneity and strength of the static magnetic field, due to the required high spectral resolution of chemical shifts, making MRS equipment that would be used for whole body composition analysis extremely expensive.

II. Magnetic Resonance Imaging (MRI). A MRI method for body composition analysis is described by Ross et al. in, *Quantification of adipose tissue by MRI: relationship with anthropometric variables*, J. Appl. Physiol. 1992:72(2) pp. 787-795, and in U.S. Pat. Nos. 5,225,781; 5,594,336; 6,147,492; and 5,644,232.

III. NMR Relaxometry. NMR relaxometry methods known in the art avoid the necessity for complicated and expensive equipment. NMR relaxometry methods known in the art, however, have several limitations, such as with respect to accuracy and precision. Kamman et al., *Multi-exponential relaxation analysis with MR imaging and NMR spectroscopy using fat-water systems*, Magn. Reson. Imaging 1987:5(5) pp. 381-392 describes a NM relaxometry method for body composition analysis. Despite extensive research and development into methods of whole body composition analysis, there is still a need for reliable, accurate, precise, and specific non-invasive methods for acquiring information relating to body fat mass, lean mass, total water content, etc.

SUMMARY OF INVENTION

One aspect of the invention is a method for measuring whole body composition. The method includes confining movement of the body to within a selected volume. A static magnetic field is induced in the volume. The method then includes inducing a pulsed radio frequency magnetic field in the volume, and receiving nuclear magnetic resonance signals from the body. The static and radio frequency magnetic fields are configured so that resonance signals from any part of the body are substantially independent of a position of the body part within the volume. Whole body composition is then assessed based on the resonance signals.

Another aspect of the invention is a nuclear magnetic resonance apparatus. An apparatus according to this aspect of the invention includes a magnet for inducing a static magnetic field within a selected volume. The magnet is configured to provide a minimum static magnetic field amplitude with respect to a size of the volume and a selected precision of measurement. The apparatus further includes an antenna for inducing a radio frequency magnetic field within the volume, means for generating radio frequency power pulses operatively coupled to the antenna, means for detecting nuclear magnetic resonance signals from within the volume, and means for analyzing composition of a body disposed within the volume.

Other aspects and advantages of the invention will be apparent from the following description and the appended claims.

DETAILED DESCRIPTION

Figure 1:
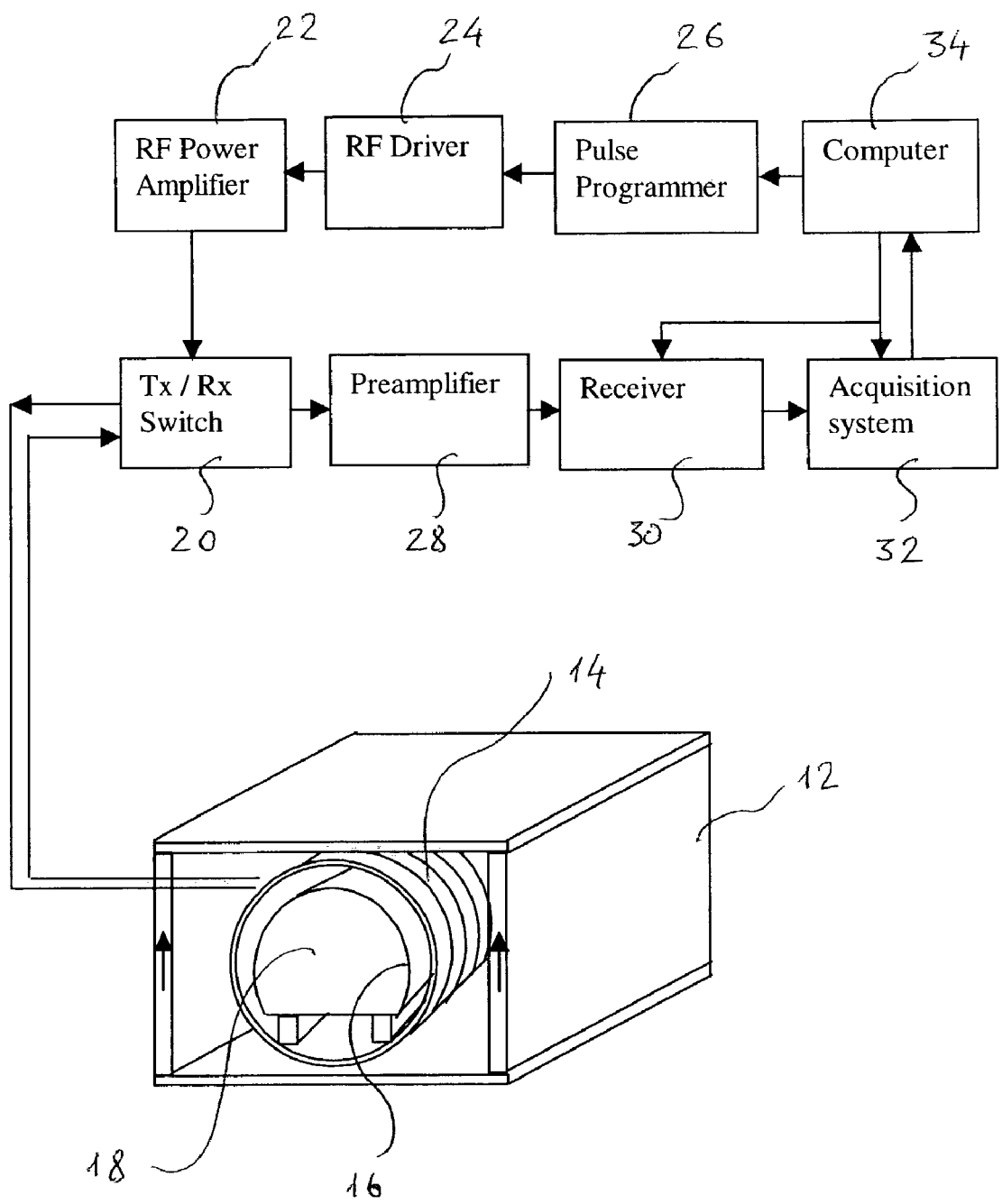
FIG. 1 shows one embodiment of a NMR apparatus according to the invention.

One embodiment of a nuclear magnetic resonance (NMR) apparatus according to the invention is shown generally in FIG. 1 at 10. The apparatus 10 includes a magnet 12 disposed around or on opposed sides of a sample chamber 18. The magnet 12 may be a permanent magnet, or all electromagnet, and is configured to induce a substantially homogeneous static magnetic field within the sample chamber 18. The volume of the sample chamber 18 may be defined by an enclosure such as a polycarbonate tube or box, shown generally at 16 in FIG. 1. The purpose of defining the chamber volume using the enclosure 16 is to precisely set the geometric boundaries of the volume in space within which a body being analyzed may move, substantially without affecting accuracy of NMR measurements performed according to the invention. The enclosure 16 may be made from any substantially electrically non-conductive and nonmagnetic material known in the art.

A radio frequency (RF) antenna 14 is disposed about the enclosure 16, typically on the exterior surface of the enclosure 16. In the present embodiment, the antenna 14 comprises a wire coil wound so that its turns lie in planes substantially perpendicular to the longitudinal axis of the chamber 18. When pulses of RF electrical power are passed through the antenna, 14, an RF magnetic field is induced within the chamber 18. Although described above in terms of coils, the antenna 14 can be configured in any other way as long as the RF magnetic field induced by the antenna 14 is substantially perpendicular to the static magnetic field induced by the magnet 12 within the volume defined by the chamber 18.

In the present embodiment, the antenna 14 performs both RF transmit and RF receive functions, and is coupled to a T/R matching circuit and switch 20. The switch 20 is under control of a computer 34 or similar programmable controller configured to operate the switch 20 such that the antenna 14 is selectively coupled to an RF power amplifier 22 during RF pulse transmission intervals, or to a receiver preamplifier 28 during NMR signal detection (receive) intervals. The input of the RF power amplifier 22 is coupled to an RF driver 24, the input of which is itself coupled to a pulse programmer 26. The pulse programmer 26 may be a separate element under control of the computer, 34 or may be a function performed by the computer 34 itself.

The receiver preamplifier 28 is coupled to an RF receiver 30, which is itself coupled to an acquisition system 32. The acquisition system may include analog to digital converters, digital filters and a recording device (not shown separately). The output of the acquisition system 32 is coupled to the computer 34 for analysis of voltages detected by the antenna 14 resulting from NMR phenomena in an object (not shown in FIG. 1) disposed in the chamber 18.

The pulse programmer 26 is configured to operate the RF driver 24 to cause generation of a succession of selected length and selected frequency RF pulses through the antenna 14, such that NMR phenomena are induced in the object (not shown). As is well known in the art, the frequency, amplitude and duration of the RF pulses are related to the amplitude of the static magnetic field within the chamber 18, and to the Larmor frequency of nuclei which are excited within the object (not shown) for NMR relaxometry analysis. For analysis of human and other animal bodies, the nuclei are typically protons ($^1H$).

In the present embodiment, the RF pulse amplitude and duration can be selected to provide first approximately 90 degree (transverse) reorientation of magnetic Spin axes of protons in the object (not shown) and then a succession of 180 degree (inverse or refocusing) magnetic spill reorientations. Each refocusing pulse is typically followed by a time interval during which the antenna 14 is coupled to the receiver pre amplifier 28 for detecting NMR phenomena from the object (not shown). Such sequences of transverse reorientation, inverse reorientation and NMR signal detection are well known in the art for determining transverse relaxation time ($T_2$) and longitudinal relaxation time ($T_1$) of materials being-analyzed.

The foregoing description of NMR apparatus and methods are well known in the art. In the invention, however, it has been determined that if certain requirements are met for the amount of spatial variation of the static and RF magnetic fields within the sample chamber 18, and requirements for the excitation spectrum of the RF magnetic field, high measurement precision can be obtained without the need to build a measuring apparatus of excessive size and cost. At the same time, apparatus and methods according to the invention which meet such requirements of magnetic field distributions and RF field spectral content are fully able to make precise measurements of whole body composition of, for example, a live, Conscious animal, even if the body being analyzed moves within the chamber 18. Apparatus and methods according to the invention make practical for the first time analysis of living, Conscious animals, including humans, for whole body composition without the need for large, expensive NMR relaxometry or MRI (imaging) systems.

In order to explain the function of the invention, first, factors which affect the accuracy of NMR measurements will be explained. An expression for the NMR signal amplitude $S(r_0, t)$ induced in an NMR receiver antenna (e.g., antenna 14 in FIG. 1) as a result of inducing NMR phenomena in an object or body being analyzed is as follows:

$$S(\vec{r}_0, t) = \omega_0 \cdot \int_{V_b} \sum_i m_i(\vec{r}, t) \cdot A(\vec{r} - \vec{r}_0) dV \qquad (1)$$

where $\omega_0$ is the NMR excitation frequency; $A(\vec{r})$ is the NMR receiving antenna spatial sensitivity function and $m_i(\vec{r}, t)$ is the nuclear magnetization of i-th body component as a function of time and position of the elementary volume dV inside the chamber 18. $\vec{r}_0$ represents position of the center of the object or body. The nuclear magnetization can be further presented in the form:

$$m_i(r,t) = m_{0i}(\vec{r}, t) \cdot k(\vec{r}) \qquad (2)$$

where $m_{0i}(\vec{r}, t)$ represents the amount of and the relaxation with respect to time of the nuclei in the i-th body component. $k(\vec{r})$ is a coefficient representing inhomogeneity of nuclear magnetic excitation conditions at every point in space within the chamber 18. The coefficient $k(\vec{r})$ depends on the spatial distribution of the RF magnetic field, the frequency spectrum of the RF magnetic field, the frequency spectrum of nuclear magnetic spins in the object being analyzed, and the RF receiver system frequency response (bandwidth). $k(\vec{r})$=const represents the condition where the nuclear magnetic excitation conditions are uniform over the entire chamber 18. This means that if the chamber 18 is filled with a homogeneous material, the magnetization of the material is spatially uniform.

The quantity of interest in body composition measurements is:

$$\sum_i \int_{V_b} m_{0i}(\vec{r}, t) dV = \sum_i M_i(\vec{r}, t), \qquad (3)$$

where $V_b$ is the body volume.

In the case of homogeneous magnetization $m_{0i}(\vec{r}, t)$=const for ($\vec{r} \in V_b$), then equations (1) and (2) allow for describing the NMR signal in the form:

$$S(\vec{r}_0, t) = \left[ V_b \cdot \sum_i m_{0i}(\vec{r}, t) \right] \cdot$$
$$(1/V_b) \cdot \int_{V_b} k(\vec{r} - \vec{r}_0) \cdot A(\vec{r} - \vec{r}_0) dV \propto \sum_i M_i(t) \qquad (4)$$

Equation (4) shows that the NMR signal from a homogeneous and homogeneously magnetized object or body is directly proportional to the quantity of the particular material of interest. Any movement of the object or body will affect the total signal amplitude but will not affect the ratio between signal components.

Homogeneous magnetization and composition is clearly not the case for inhomogeneous objects such as a living organism with naturally distributed fat and lean $m_{0i}(r,t)$ ≠const). The conditions for the NMR signal to represent true body composition in this case are $k(\vec{r} - \vec{r}_0)$=const and $A(\vec{r} - \vec{r}_0)$=const such that:

$$S(t) = const \sum_i \int_{V_b} m_{0i}(\vec{r}, t) dV \propto \sum_i M_i(t) \qquad (5)$$

Therefore, embodiments of a method and apparatus according to the invention minimize spatial variation of the coefficient k and minimize spatial variation of the antenna sensitivity function A with respect to any particular size of sample chambers It will be readily appreciated by those skilled in the art that similar results, as they pertain to accuracy and speed of measurement, could be obtained for body composition analysis by using NMR measurement systems and techniques known in the art. For example, well know NMR laboratory composition analysis systems have, in the centermost portions of their sample chambers, antenna sensitivity distribution and static magnetic field homogeneity Such that accurate composition analysis can be made on inhomogeneous and/or moving objects over a very small volume. In fact, such systems known in the art have been used successfully to perform body composition analysis of very small laboratory mice. However, the structures of such known in the art apparatus would be impractical to increase in size in order to perform similar whole body composition analysis on much larger animals, for example rats, dogs or even humans. Embodiments of methods and apparatus according to the invention, by contrast, provide accurate whole body composition of much larger animals but maintain practical size, cost and weight of the overall apparatus.

Figure 2A:
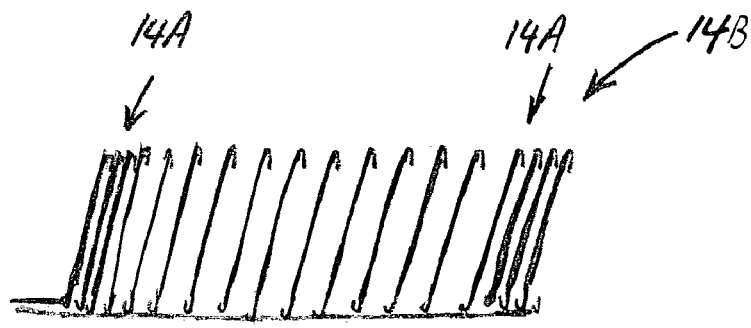
FIG. 2A shows one embodiment of an antenna according to the invention.

FIG. 2A shows an example of an antenna that generates an RF magnetic field having inhomogeneity of less than about 2% over the entire volume of the chamber (18 in FIG. 1). The antenna coil 14B has a total length along its longitudinal axis represented by $l_0$. Over the central portion of the antenna coil 14B, coil windings have a first "turn density" (number of turns per unit length along the coil axis). At each longitudinal end of the antenna 14B is a "booster coil", shown at 14A, each of which has a selected length along the axis represented by $l_j$, and a turn density of about twice that of the central portion. Preferably, the axial length each of the booster coils, $l_1$, is about one-eighth the total axial length $l_0$ of the antenna 14B. It will be readily appreciated by those skilled in the art that reduced RF field inhomogeneity could be obtained by increasing the axial length of the antenna with respect to the axial length of the sample chamber.

Advantageously, an antenna configured as shown in FIG. 2A and as described above provides reduced RF field inhomogeneity while maximizing the effective sample chamber length with respect to the antenna length along the respective longitudinal axes.

Figure 2B:
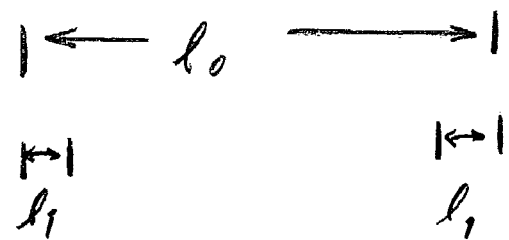
FIG. 2B shows a graph of RF magnetic field amplitude with respect to axial position along the example apparatus shown in FIG. 1.
Figure 2B:
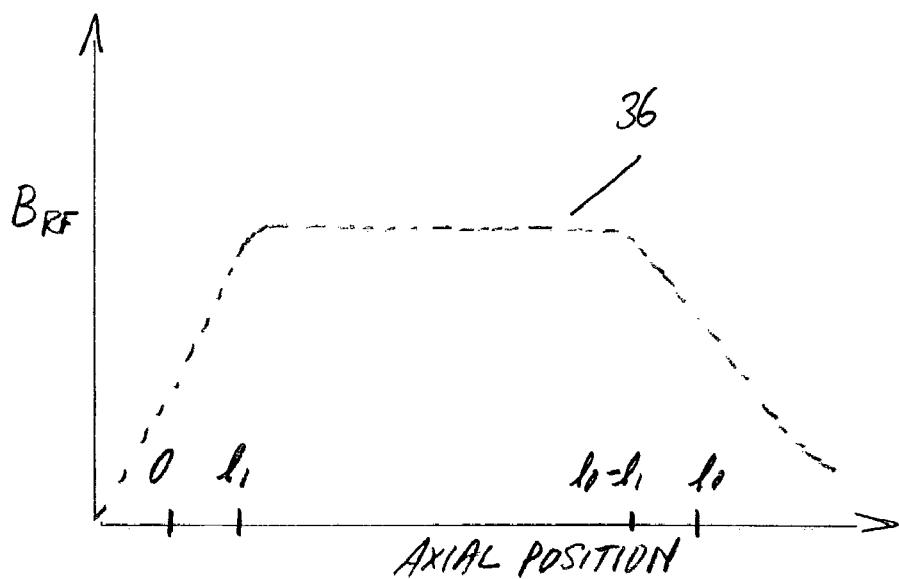
Figure 2C:
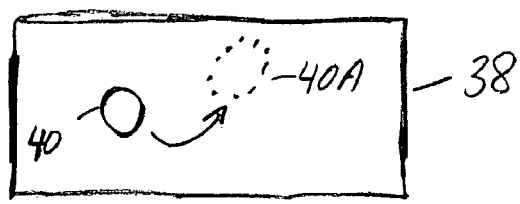
FIG. 2C illustrates possibility of movement of an object being examined by the apparatus of FIG. 1 without materially affecting measurements made by the apparatus.

The RF magnetic field distribution along the longitudinal axis of the antenna coil 14B is shown in FIG. 2B. According to the reciprocity principle, the spatial distribution of the RF magnetic field represented in FIG. 2B should be substantially the same as the spatial distribution of the antenna sensitivity function, when the same antenna is used for both RF magnetic field generation and NMR signal reception. FIG. 2C shows that an inhomogeneity 40 disposed within the axial limits 38 defined by the chamber (18 in FIG. 1) can move, such as shown at 40A in FIG. 2C, and still induce a substantially equal amplitude incremental NMR signal component in the antenna (14 in FIG. 2A). The inhomogeneity 40 may be a portion of an entire body of an animal subject to movement within the chamber (18 in FIG. 1), or may represent the entire animal disposed in a chamber larger than the animal itself.

Figure 3A:
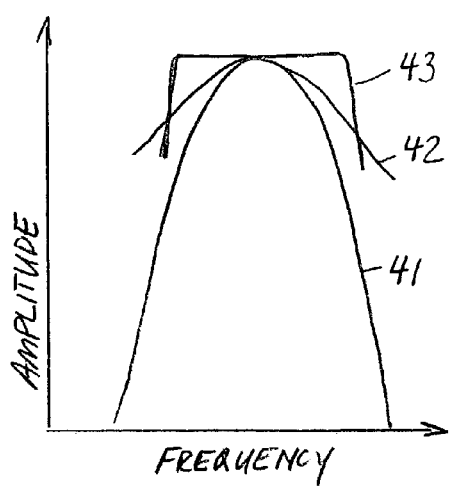
FIG. 3A is a graph of frequency content of different types RF pulses applied to the antenna of the apparatus of FIG. 1.
Figure 3C:
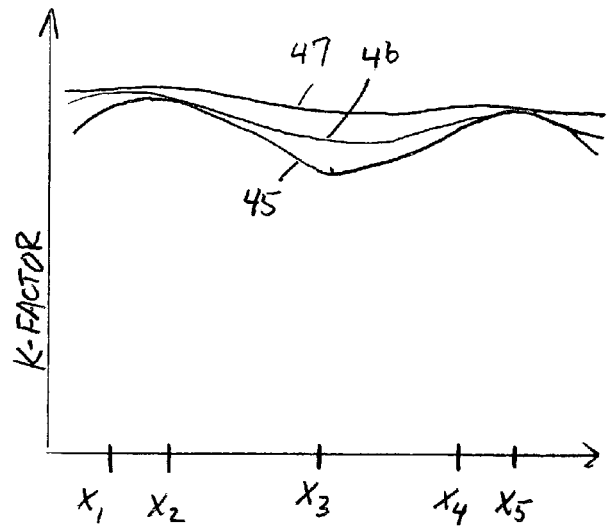
FIG. 3C is a graph of relative sensitivity of NMR measurement with respect to position within the sample chamber for various RF pulse types as shown in FIG. 2A.
Figure 3C:
Figure 3B:
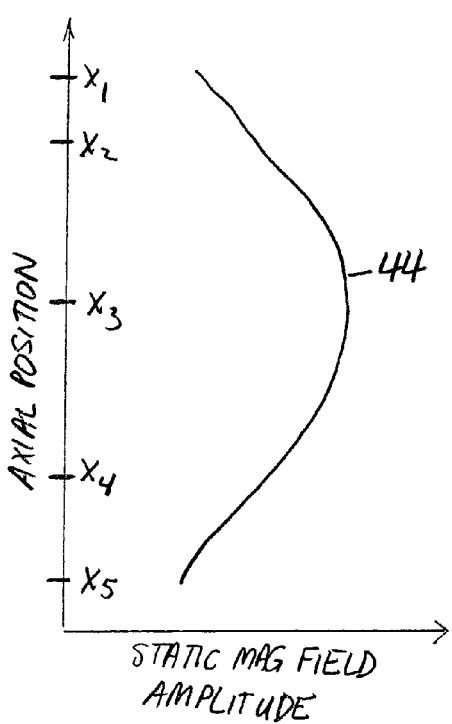
FIG. 3B is a graph of static magnetic field amplitude with respect to axial position along a sample chamber of the apparatus of FIG. 1, and corresponding magnetic resonance conditions with respect to the RF pulse frequency of FIG. 3A.

The foregoing description with respect to FIGS. 2A, 2B and 2C explains an antenna structure intended to minimize spatial variation of the antenna sensitivity function A (from equation (5) above). FIGS. 3A, 3B and 3C will be discussed below with respect to aspects of the invention related to minimizing spatial variation in the coefficient k (from equation (5) above).

FIG. 3A is a graph of amplitudes of various frequency components in RF pulses used to induce the RF magnetic field. For conventional RF pulses, shown by curve 41, the frequency spectrum of the RF magnetic field induced by these pulses transforms into spatial variation of excitation conditions, or coefficient $k(\vec{r})$ when the static magnetic field is not completely homogeneous. Variation in static magnetic field amplitude with respect to axial position is shown at curve 44 in FIG. 3B. The excitation coefficient $k(\vec{r})$ with respect to axial position x, corresponding to the static magnetic field variation (44 in FIG. 3B) and conventional RF pulse bandwidth (41 in FIG. 3A) is shown at curve 45 in FIG. 3C. Referring back to FIG. 3A, if the length of the RF pulses is shortened, the bandwidth of RF energy in the pulses is increased, as shown curve at 42. As is well known in the art, the RF pulses can be increased in amplitude in order to maintain the same amount of reorientation (same angular displacement) of the nuclear magnetic spin axes if the pulse duration is shortened. Curve 46 in FIG. 3C shows reduced variation of the coefficient $k(\vec{r})$ with respect to position when the RF magnetic field has increased bandwidth. If the increase in RF amplitude is impractical, shorter duration RF pulses at unchanged amplitude can be used, with resulting lower magnetic spin axis rotation angle. The benefit of the wider frequency bandwidth and its effect on precision of measurements outweighs some of the disadvantage of a resulting loss in NMR signal amplitude because of reduced net transverse nuclear magnetization.

Another way to optimize the RF magnetic field spectrum is the use of shaped RF pulses having an almost flat frequency spectrum. This type of frequency spectrum corresponds to a "sinc" waveform of the general form y=(sin (x)/x) in the time domain. The effect of shaped pulses is explained as applied to selective excitation in magnetic resonance imaging in, P. T. Callaghan, *Principles of Nuclear Magnetic Resonance Microscopy*, Clarendon Press, Oxford, 1991. Curve 43 in FIG. 3A shows an example bandwidth of shaped RF pulses. Curve 47 in FIG. 3C shows very little variation in excitation with respect to position when shaped pulses are used.

Yet another way to optimize the RF magnetic field spectrum is the use of composite RF pulses, a variety of which are explained in R. R. Ernst, et al., *Principles of Nuclear Magnetic Resonance in One anal Two Dimensions*. In the case of composite pulses a regular excitation or refocusing pulse is replaced by a sequence of two, three or more pulses, each of which is characterized by its own rotation angle and phase of the RF carrier. Nuclear magnetization generated using composite pulses is much less sensitive to variations in the RF magnetic field strength, and is less sensitive to static magnetic field inhomogeneity. The expression below is an example of a refocusing composite pulse (having a nominal rotation angle of 180°) containing three sub-pulses:

$$(\beta)_{\pi/2}(2\beta)_0(\beta)_{\pi/2} \qquad (6)$$

where β is the nominal rotation angle of the excitation pulse (usually 90°); and the subscripts represent the phase of the carrier frequency in the sub-pulses.

Irrespective of the type of RF pulse spectrum optimization that is used, the frequency content of the RF pulses should be selected such that even with inhomogeneity in the static magnetic field, substantially uniform nuclear magnetization occurs within any object placed in the chamber (18 in FIG. 1).

FIG. 3C illustrates the fact that in a linear approximation the coefficient $k(\vec{r})$ (or nuclear magnetization of a homogeneous object that fills all space within the object. compartment) is substantially determined by the Fourier transform, or spectrum, of the RF pulse. The statement that uniform spectral density of RF pulse causes substantially uniform magnetization holds approximately true for the non-linear (typical) case as well. It is clear from FIGS. 3A, 3B and 3C that better uniformity of the static magnetic field will also improve uniformity of the nuclear magnetization. It is to be noted, though, that merely attempting to improve the uniformity of the static magnetic field, without more, requires a dramatic increase in the size, weight and cost of the magnet, irrespective of the type of magnet being used. In the invention, therefore, optimizing the RF magnetic field properties and the spatial distribution of the antenna sensitivity can enable using substantially smaller and less expensive magnets while still providing high accuracy and precision in NMR relaxometry measurements.

Rotation angle in the interval between 90 and 180 degrees for the refocusing RF pulses is also beneficial from the point of view of saving power when a large object is under investigation. In the case of measurements performed on humans, the reduced power produces less heating and therefore is advantageous from a safety point of view.

In the description above it is assumed that the receiver channel (including antenna 14, switch 20, preamp 28 and receiver 30) has sufficient bandwidth in order to uniformly (uniform signal amplitude with respect to frequency) receive signals from parts of the object (not shown) corresponding to different resonance frequencies of nuclear magnetic spins. Alternatively, the receiver channel can have a frequency response that compensates for non-uniform excitation due to inhomogeneity in the static magnetic field and the limited, non-uniform spectrum of the RF pulses.

Figure 4:
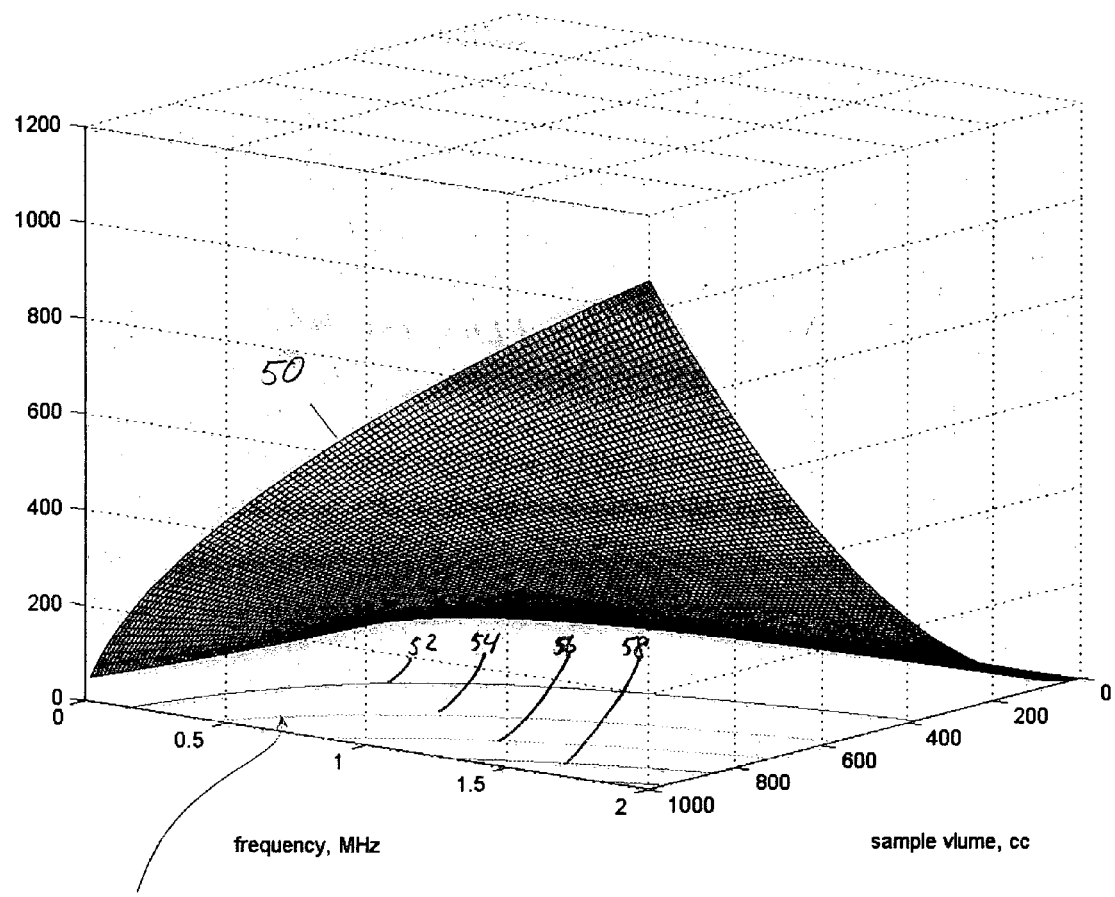
FIG. 4 is a graph of signal to noise with respect to sample chamber volume and static magnetic field amplitude.

An important relationship exists between the size of the object or body to be analyzed (related to the sample chamber volume), and the choice of NMR operating frequency (the frequency of the RF pulses applied to the antenna). As is well known in the art, the NMR frequency is proportional to the static magnetic field intensity and the gyromagnetic ratio of the nuclei being analyzed. The relationship between NMR operating frequency and the size of the body being analyzed can be used in various embodiments to select a minimum strength static magnetic field, and corresponding NMR frequency which will provide measurements having acceptable accuracy and precision. FIG. 4 shows a three-dimensional graph, at surface 50, of the signal-to-noise ratio (SNR) with respect to the sample (object or body) volume and the NMR operating frequency. For a particular value of SNR, as required to perform selected duration and yet accurate NMR measurements, there is a relationship between the minimum NMR frequency that facilitates obtaining the required accuracy with respect to the volume of the sample chamber (18 in FIG. 1) where the object is placed. The relationship for selected values of SNR is shown by curves 52, 54, 56 and 58 in FIG. 4. Curve 54, for example, represents the minimum NMR frequency as it relates, to the selected chamber volume for SNR of 100. As will be appreciated by those skilled in the art, longer duration NMR measurements sequences may be used with lower SNR. The value of SNR selected will thus be related to the speed with which NMR analysis needs to be performed on any particular type of object. Irrespective of the SNR selected, the relationship between chamber volume and minimum NMR frequency can be used to minimize, for any selected chamber volume, the strength of the magnet used to induce the static magnetic field. Designing NMR system with minimum NMR frequency thus gives benefits of reducing the size, weight and cost of the magnet assembly for any particular sample chamber volume.

All of the foregoing attributes of an apparatus according to the invention are used to maximize the volume of objects being analyzed with respect to the physical dimensions (and associated cost) of the apparatus itself. The apparatus and method of the invention can therefore be described in general terms as having a spatial distribution of the static magnetic field and of the radio frequency magnetic field selected to minimize an objective function, wherein the penalty function includes as variables the required measurement precision and at least one parameter related to the financial cost of the apparatus. This is in contrast to apparatus known in the art which must be scaled up, or increased in size (and associated cost) to make measurements of a selected accuracy on larger and larger objects.

In a method according to the invention, a live, conscious animal is placed in the sample chamber (18 in FIG. 1). The magnet (12 in FIG. 1) induces a static magnetic field in the animal. RF pulses according to a programmed sequence are passed through the antenna (14 in FIG. 1), between which pulses, NMR signals are detected by the antenna. A record is made of the NMR signals thus detected, and from the detected NMR signals, composition of various components of the animal body are analyzed. In one embodiment, the RF pulses passed through the antenna have length, amplitude and spacing between pulses to constitute the well known Carr-Purcell-Meiboom-Gill (CPMG) sequence. The signals detected using a CPMG pulse sequence constitute nuclear magnetic spin echoes. Body component composition may be determined from relative amplitudes of various relaxation time components in the total spin echo amplitude train detected. Methods for determining component contribution of various relaxation time components in a spin echo amplitude decay spectrum are well known in the art for both $T_1$ and $T_2$ relaxation measurement techniques.

Figure 5A:
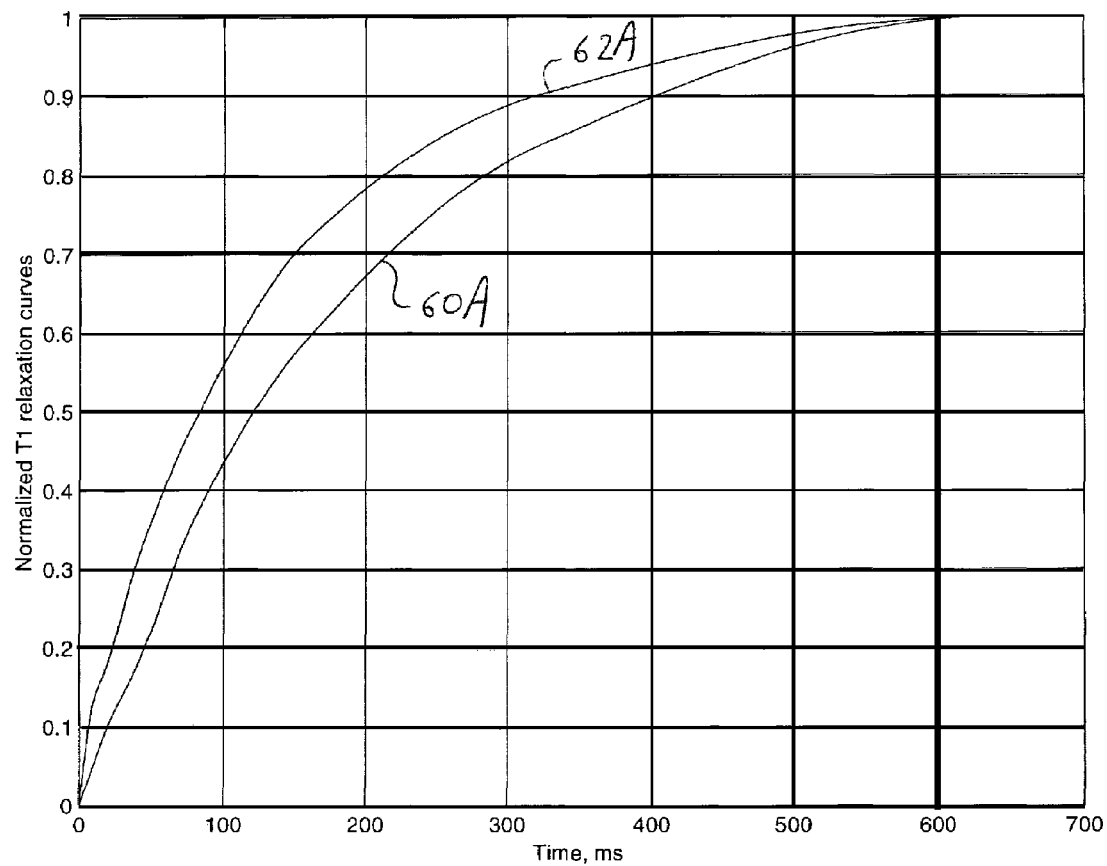
FIG. 5A is a graph of normalized longitudinal nuclear magnetic relaxation for human fat and lean tissue.
Figure 5B:
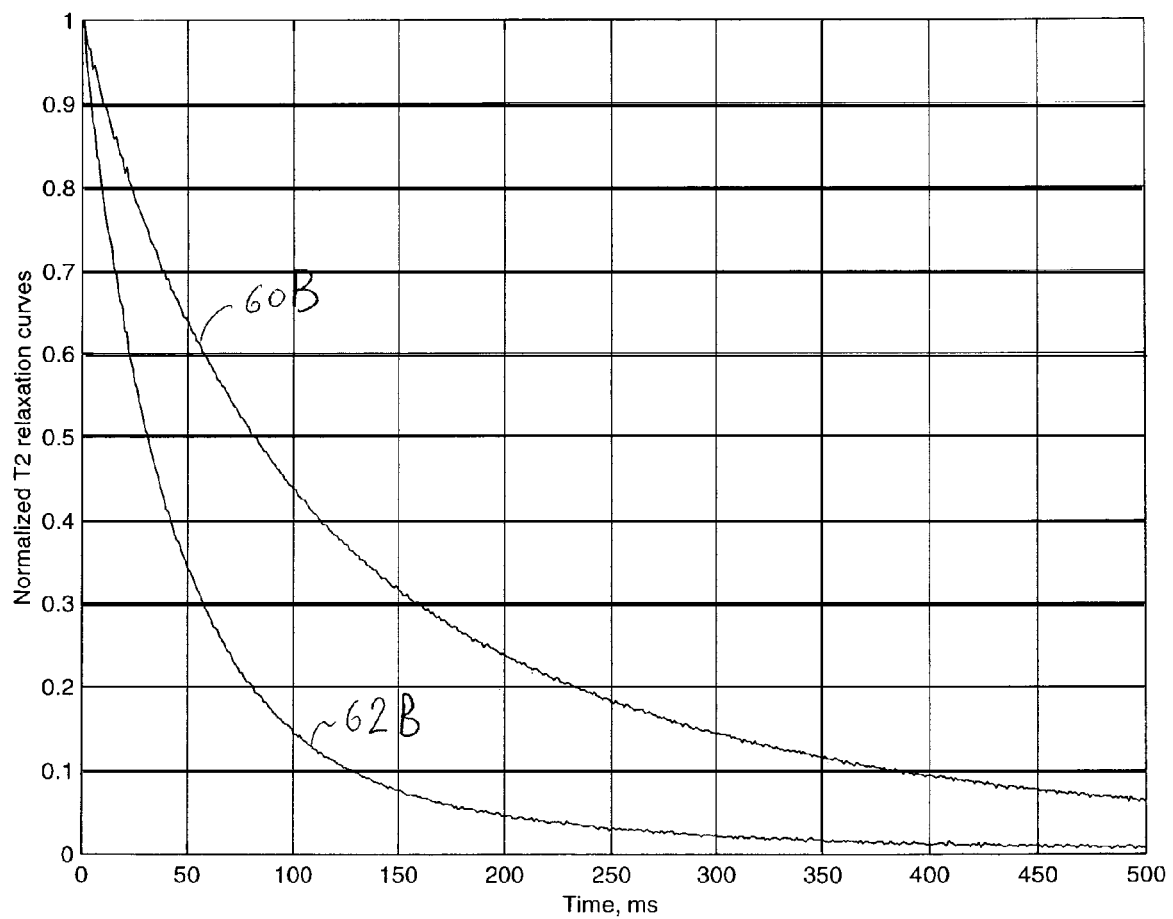
FIG. 5B is a graph of normalized transverse nuclear magnetic relaxation for human fat and lean tissue.

One implementation of a method according to the invention is an NMR measurement technique that enhances the contrast between types of animal body tissues to be differentiated. FIGS. 5A and 5B represent, respectively, longitudinal ($T_1$) and transversal ($T_2$) relaxation curves, respectively, for human fat tissue 60A, and 60B and human lean tissue 62A, 62B. FIGS. 5A and FIG. 5B show, respectively, $T_1$ and $T_2$) relaxation curves measured at NMR frequency 2 MHz. All the results represent live animal tissue, and correspond approximately to 37° C. temperature. Sufficiently high tissue signal contrast with respect to noise on the $T_2$ relaxation curve at 2 MHz (FIG. 5B) suggests that fat and lean can be effectively differentiated at this NMR frequency. It is important to note that the lower the NMR operating frequency the less expensive the implementation of NMR measurement system for the whole body composition measurement, primarily because the size of the magnet for the static magnetic field is reduced.

Figure 6:
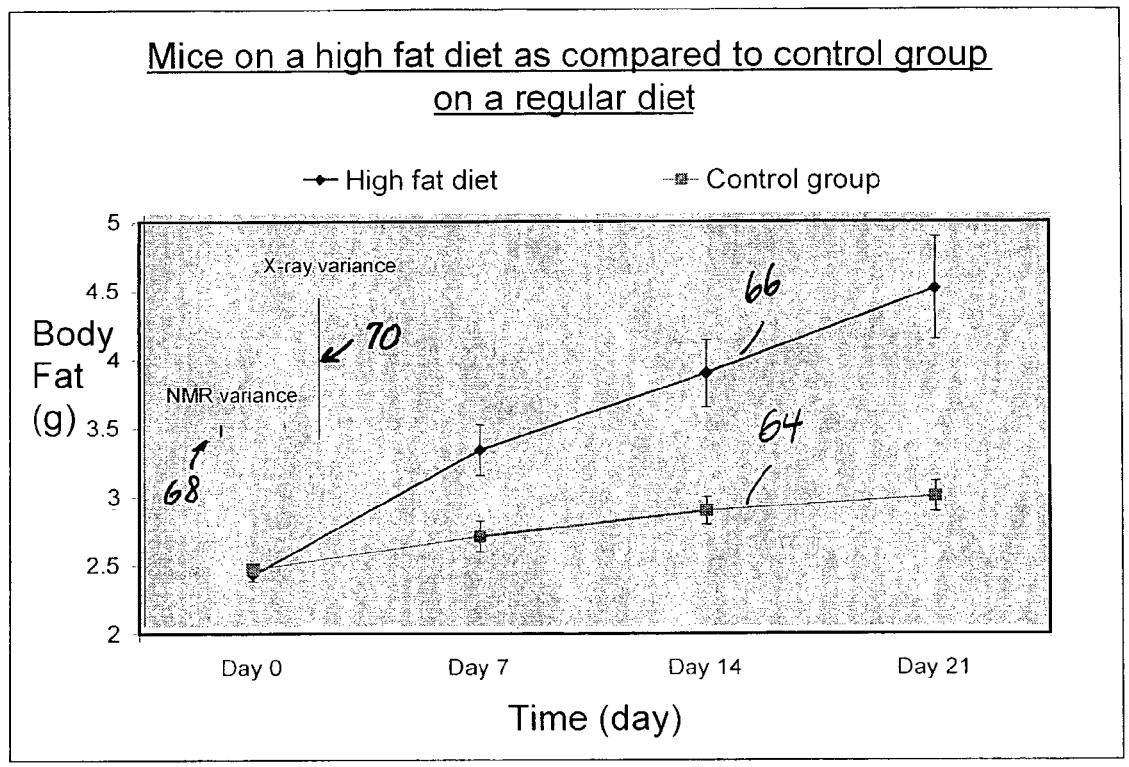
FIG. 6 shows a graph of body fat content of a control group of test mice as compared with body fat content of mice fed a high fat diet.

FIG. 6 depicts results of body composition measurement on mice using the NMR technique according to the invention. It can be shown that high precision of the measurements allows detection of small variations in fat and lean content in response to, for example, changes in a food diet. Two groups of mice were compared. Each group had 5 mice. At day 0, the average body fat content measured by NMR was 2.43 gram and the variation (standard deviation) of the body fat content was 0.05 gram. Body fat content (average) of a control group is shown by curve 64. Body fat content (average) of the group fed a high fat content diet is shown at curve 66. Variation in body fat content at each time for each group is indicated by bands at each datum point. The variation in body fat content is due to natural biological variability in "equivalent" mice and variability is NMR measurement. Over time, as the mice grew, their variability in body fat content became more pronounced. In this particular example the objective was to detect statistically significant changes with 95% confidence in fat content between the two groups within one week. The value of NMR measurement variance allows detecting a change in body fat content of about 0.6 gram, as indicated by band 68 oil the graph. However, the variance in measurement provided by X-ray (DEXA) techniques is about 20 times higher than that provided by NMR, as shown by band 70 on the graph. Therefore using X-ray techniques it is essentially impossible to measure statistically significant changes in body fat content with 95% confidence in fat content even over a time interval of three weeks. In fact, the natural biological variability in mice becomes even more pronounced with in creasing time.

Embodiments of a method and apparatus according to the various aspects of the invention provide the ability to accurately and quickly evaluate whole body composition, even on conscious, live animals, without the need for very large, very expensive NMR spectroscopy or MRI instruments.

While the invention has been described with respect to a limited number of embodiments, those skilled in the art, having benefit of this disclosure, will appreciate that other embodiments can be devised which do not depart from the scope of the invention as disclosed herein. Accordingly, the scope of tie invention should be limited only by the attached claims.

What is claimed is:

1. A method of measuring whole body composition comprising:
    confining movement of the body within a selected volume;
    inducing a static magnetic field in the volume;
    inducing a pulsed radio frequency magnetic field in the volume, the inducing the static magnetic field and pulsed radio frequency magnetic field arranged to excite nuclear magnetic resonance phenomena in the whole body substantially simultaneously and arranged to minimize spatial variation of nuclear magnetization in the body;
    receiving nuclear magnetic resonance signals from the body, wherein the receiving comprises receiving with a substantially uniform spatial sensitivity within the volume; and
    assessing whole body composition from the resonance signals.

2. The method of claim 1 wherein the pulsed radio frequency magnetic field includes substantially uniform spectral density within a predetermined frequency range, the frequency range related to a spatial distribution of the static magnetic field; and wherein the receiving is performed within a frequency range at least as large as the predetermined frequency range.

3. The method of claim 1 wherein the pulsed radio frequency magnetic field comprises composite radio frequency pulses to increase uniformity of nuclear magnetization within the volume.

4. The method of claim 1 wherein the pulsed radio frequency magnetic field comprises spectrally shaped radio frequency pulses to increase uniformity of nuclear magnetization within the volume.

5. The method of claim 1 wherein the inducing the radio frequency magnetic field comprises generating at least one excitation pulse and generating a plurality of refocusing pulses for each excitation pulse, and the receiving the resonance signal comprises measuring amplitudes of spin echoes.

6. The method of claim 5 wherein the excitation pulse and the plurality of refocusing pulses form a Carr-Purcell-Meiboom-Gill sequence, and each of the refocusing pulses reorients nuclear spin axes in the volume by about 180 degrees.

7. The method of claim 5 wherein the excitation pulse and the plurality of refocusing pulses form a Carr-Purcell-Meiboom-Gill sequence, and the refocusing pulses reorient nuclear spin axes in the volume by an angle within a range of about 90 to 180 degrees, the angle selected to reduce power consumption and to reduce radio frequency induced heating of the body.

8. The method of claim 5 wherein the excitation pulse and the plurality of refocusing pulses form a Carr-Purcell-Meiboom-Gill sequence, and the excitation pulse and the refocusing pulses each have a duration and nuclear magnetic spin rotation angles selected to make the frequency spectrum of the pulses broader than the frequency spectrum of nuclear magnetic spins that would obtain within a substantially homogeneous material disposed in the volume.

9. The method of claim 1 wherein the inducing the static magnetic field, the inducing the pulsed radio frequency magnetic field and the receiving are configured to acquire nuclear magnetic resonance signals corresponding to both transverse and longitudinal relaxation times of materials in the body.

10. The method of claim 1 wherein the static magnetic field has an amplitude selected to minimize a frequency of the radio frequency magnetic field for a selected size of the volume and a selected precision of measurement.

11. A method of measuring whole body composition comprising:
confining movement of the body within a selected volume;
inducing a static magnetic field in the volume;
inducing a pulsed radio frequency magnetic field in the volume, a spatial distribution of the static magnetic field and of the radio frequency magnetic field selected to minimize an objective function, the objective function including required measurement precision and at least one parameter related to cost of implementation of the method;
receiving nuclear magnetic resonance signals from the body; and
assessing whole body composition based on the resonance signals.

12. The method of claim 11 wherein the receiving the resonance signals comprises receiving with a substantially uniform spatial sensitivity within the volume.

13. The method of claim 11 wherein the pulsed radio frequency magnetic field includes substantially uniform spectral density within a predetermined frequency range, the frequency range related to spatial distribution of the static magnetic field; and wherein the receiving is performed within a frequency range at least as large as the predetermined frequency range.

14. The method of claim 11 wherein the pulsed radio frequency magnetic field comprises composite radio frequency pulses to increase uniformity of nuclear magnetization within the volume.

15. The method of claim 11 wherein the receiving comprises receiving with a substantially uniform spatial sensitivity within the volume.

16. The method of claim 11 wherein the inducing the radio frequency magnetic field comprises generating at least one excitation pulse and generating a plurality of refocusing pulses for each excitation pulse, and the receiving the resonance signal comprises measuring amplitudes of spin echoes.

17. The method of claim 16 wherein the excitation pulse and the plurality of refocusing pulses form a Carr-Purcell-Meiboom-Gill sequence, and each of the refocusing pulses reorients nuclear spin axes in the volume by about 180 degrees.

18. The method of claim 16 wherein the excitation pulse and the plurality of refocusing pulses form a Carr-Purcell-Meiboom-Gill sequence, and the refocusing pulses reorient nuclear spin axes in the volume by an angle within a range of about 90 to 180 degrees, the angle selected to reduce power consumption and to reduce radio frequency induced heating of the body.

19. The method of claim 16 wherein the excitation pulse and the plurality of refocusing pulses form a Carr-Purcell-Meiboom-Gill sequence, and the excitation pulse and the refocusing pulses each have a duration and nuclear magnetic spin rotation angles selected to make the frequency spectrum of the pulses broader than the frequency spectrum of nuclear magnetic spins that would obtain within a substantially homogeneous material disposed in the volume.

20. The method of claim 11 wherein the inducing the static magnetic field, the inducing the pulsed radio frequency magnetic field and the receiving are configured to acquire nuclear magnetic resonance signals corresponding to both transverse and longitudinal relaxation times of materials in the body.

21. The method of claim 11 wherein the static magnetic field has an amplitude selected to minimize a frequency of the radio frequency magnetic field for a selected size of the volume and a selected accuracy of measurement.

22. A nuclear magnetic resonance apparatus, comprising:
a magnet for inducing a static magnetic field within a selected volume, the magnet configured to provide a minimum static magnetic field amplitude with respect to a size of the volume and a selected accuracy of measurement, the magnet configured to induce a substantially homogeneous static magnetic field within the volume;
an antenna for inducing a radio frequency magnetic field within the volume, wherein the antenna is configured to have a substantially constant spatial sensitivity within the volume;
means for generating radio frequency power pulses operatively coupled to the antenna, the magnet, the antenna and the means for generating configured to induce nuclear magnetic resonance phenomena in the entirety of a body disposed in the volume substantially simultaneously;

means for detecting nuclear magnetic resonance signals from within the volume; and means for analyzing composition of the body from the nuclear magnetic resonance signals.

23. The apparatus as defined in claim 22 wherein the antenna comprises a longitudinally wound coil having a booster coil at each axial end thereof.

24. The apparatus as defined in claim 23 wherein an axial length of each booster coil is about one eighth an overall axial length of the antenna, and a coil turn density of each booster coil is about twice a turn density of a central portion of the antenna.

25. The apparatus as defined in claim 22 wherein the means for generating radio frequency power pulses is configured to produce a pulse sequence and the means for detecting is configured to measure spin echo amplitudes such that at least one of a transverse relaxation time distribution and longitudinal relaxation time distribution of a body disposed in the volume is determinable.

26. The apparatus as defined in claim 22 wherein the means for analyzing comprises means for determining fractional amounts of selected materials within a whole body disposed in the volume.

27. The apparatus as defined in claim 22 wherein the means for generating radio frequency power pulses comprises means for selecting a refocusing pulse angle to within a range of 90 to 180 degrees to reduce inductive heating of an object disposed within the volume.

28. The apparatus as defined in claim 22 wherein the means for generating radio frequency power pulses comprises means for generating substantially uniform spectral density in the power pulses within a selected frequency range.

29. The apparatus as defined in claim 22 wherein the means for generating radio frequency power pulses comprises means for generating composite pulses.

30. The apparatus as defined in claim 22 wherein the means for generating radio frequency power pulses comprises means for generating spectrally shaped pulses.

31. A nuclear magnetic apparatus, comprising:

a magnet for inducing a static magnetic field within a selected volume;

an antenna for inducing a radio frequency magnetic field within the volume, wherein the antenna is configured to have a substantially constant spatial sensitivity within the volume;

means for generating radio frequency power pulses operatively coupled to the antenna;

means for detecting nuclear magnetic resonance signals from within the volume, wherein the magnet, the antenna and the means for generating are configured to provide a maximum size of the selected volume with respect to physical dimensions of the magnet for a selected accuracy of measurement, wherein the magnet, the antenna and the means for generating are arranged to induce substantially uniform nuclear magnetization within the volume; and means for analyzing composition of a body disposed within the volume.

32. The apparatus as defined in claim 31 wherein the antenna comprises a longitudinally wound coil having a booster coil at each axial end thereof.

33. The apparatus as defined in claim 32 wherein an axial length of each booster coil is about on eighth an overall axial length of the antenna, and a coil turn density of each booster coil is about twice a turn density of a central portion of the antenna.

34. The apparatus as defined in claim 31 wherein the means for generating radio frequency power pulses is configured to conduct a pulse sequence and the means for detecting is configured to measure spin echo amplitudes such that at least one of a transverse relaxation time distribution and longitudinal relaxation time distribution of a body disposed in the volume is determinable.

35. The apparatus as defined in claim 31 wherein the means for analyzing comprises means for determining fractional amounts of selected materials within a whole body disposed in the volume.

36. The apparatus as defined in claim 31 wherein the means for generating radio frequency power pulses comprises means for selecting a refocusing pulse angle to within a range of 90 to 180 degrees to reduce inductive heating of an object disposed within the volume.

37. The apparatus as defined in claim 31 wherein the means for generating radio frequency power pulses comprises means for generating substantially uniform spectral density in the power pulses within a selected frequency range.

38. The apparatus as defined in claim 31 wherein the means for generating radio frequency power pulses comprises means for generating composite pulses.

39. The apparatus as defined in claim 31 wherein the means for generating radio frequency power pulses comprises means for generating spectrally shaped pulses.

40. The apparatus as defined in claim 31 wherein an amplitude of the static magnetic field is selected to be substantially a minimum corresponding to a selected precision of measurement.

* * * * *